TRANSISTOR HIGH CURRENT SWITCHING AND INVERTER CIRCUITS

Filed Aug. 26, 1968

INVENTOR
DALE M. BAUGHER
BY Simon Yaffee
ATTORNEY

United States Patent Office 3,546,627

Patented Dec. 8, 1970

3,546,627

TRANSISTOR HIGH CURRENT SWITCHING AND INVERTER CIRCUITS

Dale M. Baugher, Flemington, N.J., assignor to RCA Corporation, a corporation of Delaware Filed Aug. 26, 1968, Ser. No. 755,363
Int. Cl. H03k 3/30
U.S. Cl. 331—113 8 Claims

ABSTRACT OF THE DISCLOSURE

A solid state high current switching circuit using at least one high current transistor is provided in which the transistor is alternately rendered conductive and non-conductive. Such control of a high current transistor normally requires a large control current. Furthermore, energy is wasted when the transistor which should be non-conductive remains conductive. Circuit elements including a further transistor are provided to reduce the control current required by the switching circuit including the high current transistor with means being provided to cause saturation of the high current transistor when conductive and to cause sharp cut-off of the high current transistor when not conductive without additional supply voltages, whereby a more efficient switching circuit is provided. The switching circuit is described for use in an inverter.

BACKGROUND

High power switching means including a transistor can be used to interrupt the flow of high currents at a high rate of speed. Transistors that will interrupt high current require the supplying of a control current to the bases thereof which may be as high as 20% of the collector current. In accordance with known circuits, additional transistors may be connected to supply the base current required by the high current transistors which interrupt the high currents, whereby the known circuit, including the several transistors, require less control current than the single transistor circuit. However, in these known circuits it is impossible to cause the high current transistors to saturate or to become non-conductive sharply, whereby the resulting plural transistor circuit when used as a switching circuit is very inefficient. Furthermore, if a plurality of transistors which are alternately conductive are used in an inverter, the transistors should not be conductive simultaneously, since losses result from such simultaneous conduction.

SUMMARY

A switching circuit is provided in which a low current transistor is connected to supply the required base current for a high current transistor which becomes alternately conductive and non-conductive, and circuit means are provided to assist in causing saturation of the high current transistor when conductive and to cause blocking thereof when not conductive. This means may include an additional winding on the output transformer included in the switching circuit and may also include a properly connected unidirectional diode. A pair of high current transistors, each having a low current transistor connected thereto, can be so connected as to provide an inverter in which the high current transistors are alternately conductive, the transformer windings and diodes tending to prevent simultaneous conduction of both of the high current transistors.

DESCRIPTION

Figure 1:
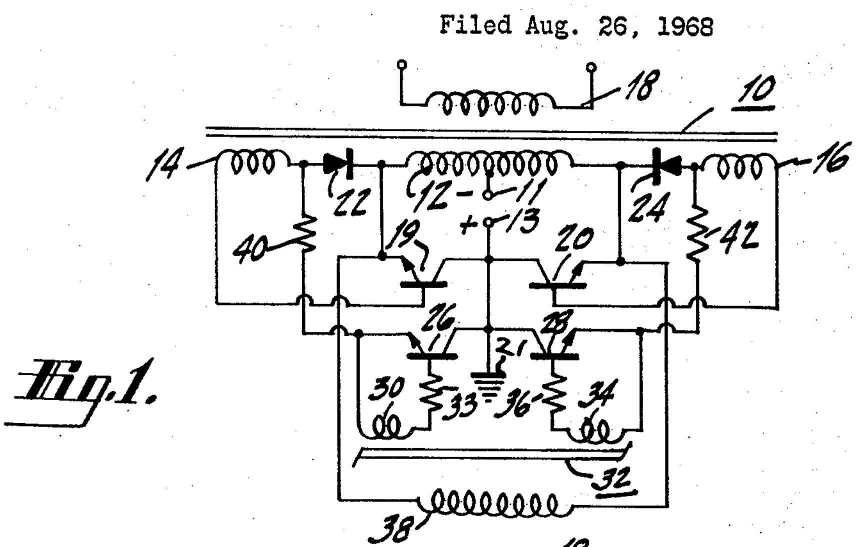
Figure 2:
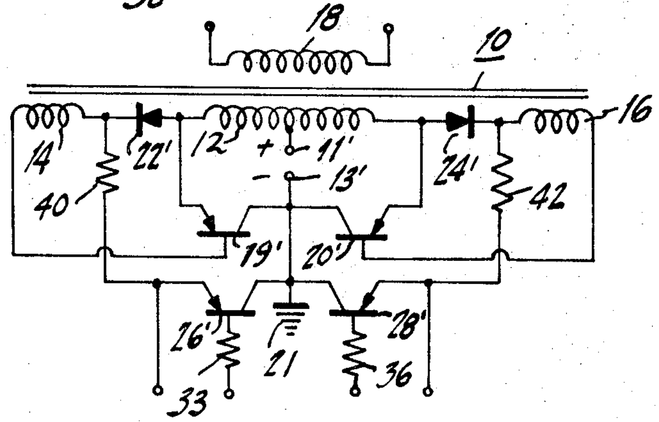
Figure 3:
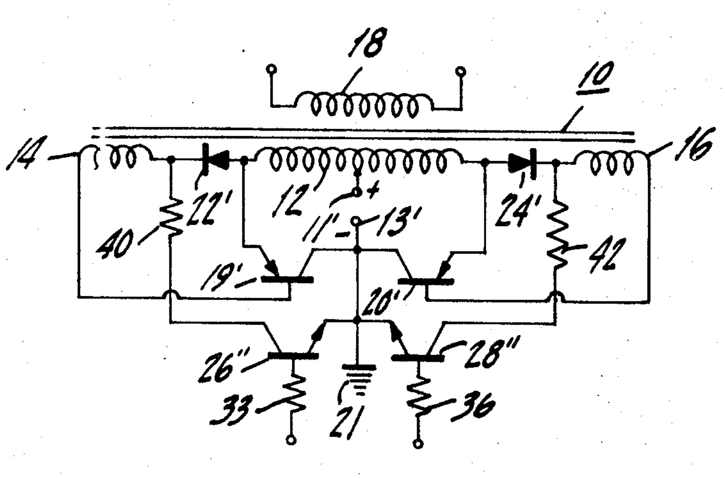

The invention will be better understood upon reading the following description in connection with the accompanying drawing in which FIGS. 1, 2 and 3 illustrate circuits embodying the invention.

Turning first to FIG. 1, an iron core power or output transformer 10 is provided with four windings including a center tapped primary winding 12 and three secondary windings 14, 16 and 18. The winding 18 may comprise the output means for the inverter to be described. The emitters of two high current NPN transistors 19 and 20 are connected to the respective end terminals of the winding 12, whose center tap is connected to the negative terminal 11 of a power source (not shown). The collectors of the two transistors 19 and 20 are connected together and to the positive terminal 13 of the power source and to ground 21. The base of the transistor 19 is connected through the secondary winding 14 to the anode of a diode 22. The cathode of the diode 22 is connected to the emitter of the transistor 19. The base of the transistor 20 is connected through the secondary winding 16 to the anode of a diode 24. The cathode of the diode 24 is connected to the emitter of the transistor 20.

The collectors of two NPN transistors 26 and 28 are connected together and to ground 21. The emitter of the transistor 26 is connected to its base by way of a secondary winding 30 of a saturating driver transformer 32 and a resistor 33 in series. The base of the transistor 28 is connected to its emitter by way of another secondary winding 34 of the transformer 32 and a resistor 36 in series. The primary winding 38 of the transformer 32 is connected across the primary winding 12 of the transformer 10. A resistor 40 connects the emitter of the transistor 26 to the junction of the winding 14 and the diode 22. A resistor 42 connects the emitter of the transistor 28 to the junction of the winding 16 and the diode 24.

The windings 14 and 16 are as nearly identical as practical, as are the diodes 22 and 24, the transistors 19 and 20, the windings 30 and 34, and the transistors 26 and 28. The transformer 10 is so chosen that it does not saturate during the operation of the inverter of which it is a part. The transformer 32, however, is saturable. The transistors 19 and 20 are of the high current type and the transistors 26 and 28 may be of the type having a high Beta whereby the transformer 32 may be very small.

When a power source is connected to the terminals 11 and 13, one of the transistors 19 or 20 will conduct a little more current than the other. Let it be assumed that the transistor 19 conducts more than the transistor 20. Then, the voltage induced in the portion of the winding 12 that is across the emitter to collector path of the transistor 19 is greater than the voltage induced in the other half of the winding 12. The voltage induced in the winding 16 is such as to apply a back bias to the emitter of the transistor 20 by way of the diode 24 thereby to reduce the conductivity of the transistor 20. It is noted that when the end of the winding 14 that is connected to the anode of the diode 22 is negative, the diode 22 stops flow of the current due to the voltage induced in the winding 14 in the circuit including the base and the emitter of the transistor 19, whereby the voltage induced in the winding 14 is not directly applied between the emitter and the base of the transistor 19 at this time. A path exists for drive or base current for the transistor 19 from the positive terminal 13, through the collector to emitter path of the transistor 26, through the resistor 40 and the winding 14 and through the base to emitter path of the transistor 19 back to the negative terminal 11 of the source. The voltage induced in the winding 12 is applied across the winding 38 of the transformer 32, whereby the voltage applied between the emitter and base of the transistor 26 is in the direction to make the transistor 26 highly conductive. The voltage induced in the winding 14 adds to this base current for the transistor 19, whereby the transistor 19 is fully conductive. The current in the winding 38 causes the transformer 32 to saturate, whereby the voltage induced in the winding 30 is reversed and the transistor 26 becomes non-conductive preventing the flow of base current for the transistor 19 through the transistor 26. The current flow in the portion of the winding 12 that is across the emitter and collector of the transistor 19 decreases and the voltage induced in the winding 14 is such that the terminal of the winding 14 that is connected to the diode 22 is positive, whereby the diode 22 permits the application of reverse or blocking bias to the emitter of the transistor 19, and the transistor 19 rapidly becomes fully non-conductive. The voltage now applied to the winding 38 is such as to make the transistor 28 conductive, whereby the transistor 20 conducts. The voltage induced in the winding 16 is in such a direction as to apply more biasing current to the base of the transistor 20, whereby the transistor 20 becomes fully conductive. The transistor 19 is blocked, and the cycle continues. It is seen that the voltage induced in the windings 14 and 16 tends to increase the flow of current in the transistors 19 and 20 respectively when the current flow in these transistors is increasing, and tends to block the transistors 19 and 20 respectively when the flow of current in the transistors 19 and 20 is decreasing, whereby the transistors 19 and 20 tend to be either fully conductive or non-conductive. It is called to attention that this change in conductivity from full conductivity to non-conductivity is accomplished in the described circuit without the necessity of a supply of current other than or in addition to the supply connected between the terminals 11 and 13. Also, the overlap of conductivity of the two transistors 19 and 20 is eliminated or greatly reduced.

Thus, FIG. 1 illustrates an inverter in which the transistors 19 and 20 are rendered alternately conductive and non-conductive by feedback from the output transformer. When the saturable transformer 32 and its windings 30, 34 and 38 are omitted, a switching circuit results in which the current for driving the transistors 19 and 20 alternately conductive and non-conductive can be provided by outside sources (not shown) connected respectively between the base and emitter of each of the two drive transistors 26 and 28. Such a circuit is shown in FIG. 2 in which however PNP transistors 19', 20', 26' and 28' are used instead of NPN transistors 19, 20, 26 and 28. To permit the use of the PNP transistors in FIG. 2, the diodes 22' and 24' are reversed in direction and the source (not shown) connected between the terminals 11' and 13' is reversed in polarity, both with respect to the similar elements of FIG. 1. Other similar elements in FIGS. 1 and 2 have been given the same reference characters.

All the transistors used in an inverter or switching circuit according to this invention need not be of the same type but complementary types may be used in the same circuit as shown in FIG. 3. In FIGS. 2 and 3, the same reference characters have been given to similar elements. It is noted however that in FIG. 3 NPN transistors 26'' and 28'' have been substituted respectively for the PNP transistors 26' and 28' of FIG. 2 and that in FIG. 3 the emitters of the transistors 26'' and 28'' are connected together while the collectors of the transistors 26'' and 28'' are connected respectively to the resistors 40 and 42. The external drive for the transistors 26'' and 28'' is between the bases thereof and ground 21.

Similarly PNP drive transistors may be used with NPN high current transistors. Such a circuit is derived from the circuit of FIG. 1 by taking out the NPN transistors 26 and 28 and putting in PNP transistors whose emitters are connected together and to ground and whose collectors are respectively connected to the resistors 40 and 42. The drive, again, is between the bases of the substituted transistors and ground.

To make inverters out of switch circuits such as those of FIGS. 2 and 3, a saturable core drive transformer such as 32 of FIG. 1 may be provided, the secondary windings thereof being connected between emitters and bases of the drive transistors (26', 28' in FIG. 2) and the primary winding of the drive transformer being coupled to the primary winding of the power transformer.

What is claimed is:

1. A switching circuit comprising:

a high current transistor characterized by emitter, collector, and base electrodes;

a second transistor for providing base current to said high current transistor, said second transistor characterized by emitter, collector, and base electrodes;

a pair of input terminals adapted for connection to a source of potential;

means including a diode for connecting one of said emitter and collector electrodes of said high current transistor in circuit with one of said emitter and collector electrodes of said second transistor, the remaining of said emitter and collector electrodes being connected in circuit with one of said pair of terminals;

a power transformer having primary and secondary windings, at least a portion of said primary winding being connected in circuit with said one of said emitter and collector electrodes of said high current transistor and the remaining one of said pair of terminals, said secondary winding being connected in circuit with the base electrode of said high current transistor and said one of said emitter and collector electrodes of said second transistor; and means for providing base current to the base electrode of said second transistor.

2. A switching circuit in accordance with claim 1 further comprising a saturable core transformer having primary and secondary windings. said means for providing base current to the base electrode of said second transistor including said secondary winding of said saturable core transformer, the primary winding of said saturable core transformer being coupled across the primary winding of said power transformer, whereby the polarity of the voltage induced in the secondary winding of said saturable core transformer periodically reverses causing said second transistor to switch between conducting and non-conducting states.

3. A DC to AC inverter circuit comprising, first and second high current transistors characterized by emitter, collector, and base electrodes, first and second low current transistors for providing base current to said first and second high current transistors respectively, said first and second low current transistors characterized by emitter, collector, and base electrodes, a pair of input terminals adapted for connection to a source of DC potential, first circuit means including a first diode for connecting one of said emitter and collector electrodes of said first high current transistor in circuit with one of said emitter and collector electrodes of said first low current transistor, second circuit means including a second diode for connecting one of said emitter and collector electrodes of said second high current transistor in circuit with one of said emitter and collector electrodes of said second low current transistor, the remaining of said emitter and collector electrodes being connected in circuit with one of said pair of input terminals, a power transformer characterized by a primary winding having a center tap and a series of secondary windings, said primary winding being serially connected between said ones of said emitter and collector electrodes of said first and second high current transistors, said center tap being connected in circuit with the other of said pair of input terminals.

first and second of said series of secondary windings being connected in circuit with the base electrodes of said first and second high current transistors and said ones of said emitter and collector electrodes of said first and second low current transistors respectively, a further secondary winding adapted to serve as an output winding from which an AC output may be derived, and means for providing base current to the base electrodes of said first and second low current transistors.

4. An inverter circuit in accordance with claim 7 further comprising a saturable core transformer having a primary winding and at least two secondary windings, said means for providing base current to the base electrodes of said first and second low current transistors including said secondary windings of said saturable core transformer, the primary winding of said saturable core transformer being coupled across the primary winding of said power transformer.

5. A switching circuit comprising:

a high current transistor and a low current transistor, each having an input, an output and a control electrode. current being able to flow only from said input to said output electrode;

a diode having an anode and a cathode;

means for coupling one of said input and output electrodes of said low current transistor to one of said anode and cathode of said diode to form a first circuit through which current can flow;

means for connecting the other of said anode and cathode of said diode to one of said input and output electrodes of said high current transistor and for connecting the other of said input and output electrodes of said low current transistor to the other of said input and output electrodes of said high current transistor, said input and output electrodes of said high current transistor being poled such that said high current transistor blocks any current which would be applied thereto from said first circuit;

a power transformer having a primary winding and a secondary winding;

means for connecting said secondary winding between the control electrode of said high current transistor and said one of said anode and cathode of said diode;

a pair of input terminals adapted for connection to a source of potential, one of said pair of terminals being coupled to the other of said input and output electrodes of said high current transistor;

means for connecting at least a portion of said primary winding of said power transformer between the one of said input and output electrodes of said high current transistor and the remaining one of said pair of terminals; and means for applying a switching signal to the control electrode of said low current transistor to cause a switching signal to be applied to the control electrode of said high current transistor.

6. The invention according to claim 5 wherein said means for applying said switching signal comprises a saturable core transformer having a primary winding coupled in parallel with the primary winding of said power transformer and a secondary winding coupled between said control electrode and one of said input and output electrodes of said low current transistor.

7. The invention according to claim 5 wherein said switching circuit further comprises a second high current transistor and a second low current transistor each of which have an input, an output and a control electrode, current being able to flow only from said input to said output electrode, and a second diode having an anode and a cathode, and wherein said power transformer further includes a second secondary winding, one of said input and output electrodes of said second low current transistor being connected to one of said anode and cathode of said second diode to form a second circuit through which current can flow, the other of said anode and cathode of said second diode being connected to one of said input and output electrodes of said second high current transistor and the other of said input and output electrodes of said second low current transistor being coupled to the other of said input and output electrodes of said second high current transistor, said input and output electrodes of said second high current transistor being poled such that said second high current transistor blocks any current which would be applied thereto from said second circuit, said second secondary winding of said power transformer being coupled between the control electrode of said second high current transistor and said one of said anode and cathode of said second diode, said one of said pair of terminals being further coupled to the other of said input and output electrodes of said second high current transistor, at least a second portion of said primary winding of said power transformer being coupled between said remaining one of said pair of terminals and said one of said input and output electrodes of said high current transistor, and means for applying a switching signal to the control electrode of said second low current transistor to cause a switching signal to be applied to the control electrode of said second high current transistor.

8. The invention according to claim 7 wherein said switching circuit further comprises a saturable core transformer having a primary winding and a pair of secondary windings, said primary winding of said saturable core transformer being coupled in parallel with said primary winding of said power transformer, one of said secondary windings of said saturable core transformer being coupled to the control electrode of said first low current transistor to provide the switching signal to be applied thereto, and the second of said secondary winding of said saturable core transformer being coupled to the control electrode of said second low current transistor to provide the switching signal to be applied thereto.

References Cited

UNITED STATES PATENTS

| | | | |
|---|---|---|---|
| 3,344,362 | 9/1967 | Lingle | 331—113.1 |
| 3,345,580 | 10/1967 | Tracy | 331—113.1 |

ROY LAKE, Primary Examiner

S. H. GRIMM, Assistant Examiner

U.S. Cl. X.R.

307—254

UNITED STATES PATENT OFFICE

CERTIFICATE OF CORRECTION

Patent No. 3,546,627 Dated December 8, 1970

Inventor(s) Dale M. Baugher

It is certified that error appears in the above-identified patent and that said Letters Patent are hereby corrected as shown below:

Column 5, line 10 Change "Claim 7" to read --Claim 3--.

Signed and sealed this 29th day of June 1971.

(SEAL)
Attest:

EDWARD M.FLETCHER,JR.
Attesting Officer

WILLIAM E. SCHUYLER, JR.
Commissioner of Patents